(12) United States Patent
Doberenz (10) Patent No.: US 6,658,732 B2
(45) Date of Patent: Dec. 9, 2003

(54) METHOD OF MAKING HIGHER IMPEDANCE TRACES ON LOW IMPEDANCE CIRCUIT BOARD

(75) Inventor: Philip W. Doberenz, Tigard, OR (US)

(73) Assignee: Intel Corporation, Santa Clara, CA (US)

( * ) Notice: Subject to any disclaimer, the term of this patent is extended or adjusted under 35 U.S.C. 154(b) by 88 days.

(21) Appl. No.: 09/954,357

(22) Filed: Sep. 12, 2001

(65) Prior Publication Data

US 2002/0040807 A1 Apr. 11, 2002

Related U.S. Application Data

(62) Division of application No. 09/677,128, filed on Sep. 29, 2000.

(51) Int. Cl.[7] .................................................. H05K 3/10
(52) U.S. Cl. ...................................................... 29/846
(58) Field of Search ........................ 29/825, 846, 852, 29/847, 832

(56) References Cited

U.S. PATENT DOCUMENTS

| | | |
|---|---|---|
| 4,685,033 A | 8/1987 | Inoue |
| 5,519,176 A | 5/1996 | Goodman et al. |
| 5,633,479 A | 5/1997 | Hirano |
| 5,719,750 A | 2/1998 | Iwane |
| 6,180,215 B1 | 1/2001 | Sprietsma et al. |
| 6,184,478 B1 | 2/2001 | Imano et al. |
| 6,218,631 B1 | 4/2001 | Hetzel et al. |
| 6,239,485 B1 | 5/2001 | Peters et al. |

OTHER PUBLICATIONS

Electrical Design and Simulation of High Density Printed Circuit Boards, IEEE Transactions Advanced Packaging, vol. 22, No. Aug. 1999. pp. 416–423 by Swirbel et al.*

* cited by examiner

*Primary Examiner*—Carl J. Arbes
(74) *Attorney, Agent, or Firm*—Blakely, Sokoloff, Taylor & Zafman LLP (57) ABSTRACT

The present invention is a circuit board having a plurality of voids in a conductive reference plane to increase the characteristic impedance of a signal trace. The circuit board of the present invention comprises a conductive reference plane having a plurality of voids formed therein, and a signal trace formed over the conductive reference plane.

4 Claims, 7 Drawing Sheets

METHOD OF MAKING HIGHER IMPEDANCE TRACES ON LOW IMPEDANCE CIRCUIT BOARD

This is a Divisional Application of Ser. No. 09/677,128 filed Sep. 29, 2000, which is presently pending.

BACKGROUND OF THE INVENTION

1. Field of the Invention

The present invention relates generally to the field of printed circuit boards ("PCBs"). More particularly, the present invention relates to a method of making higher impedance traces on a low impedance circuit board.

2. Discussion of Related Art

The common types of PCBs are a double-sided PCB and multi-layered PCB. A double-sided PCB includes conductive planes formed on the both sides of an insulation layer. A multi-layered PCB includes a plurality of conductive planes and insulation layers. In a multi-layered PCB, an insulation layer is typically formed in between conductive planes. The multi-layered PCB can have three or more conductive planes. The conductive planes refer to signal trace layers, power planes, or ground planes.

Figure 1A:
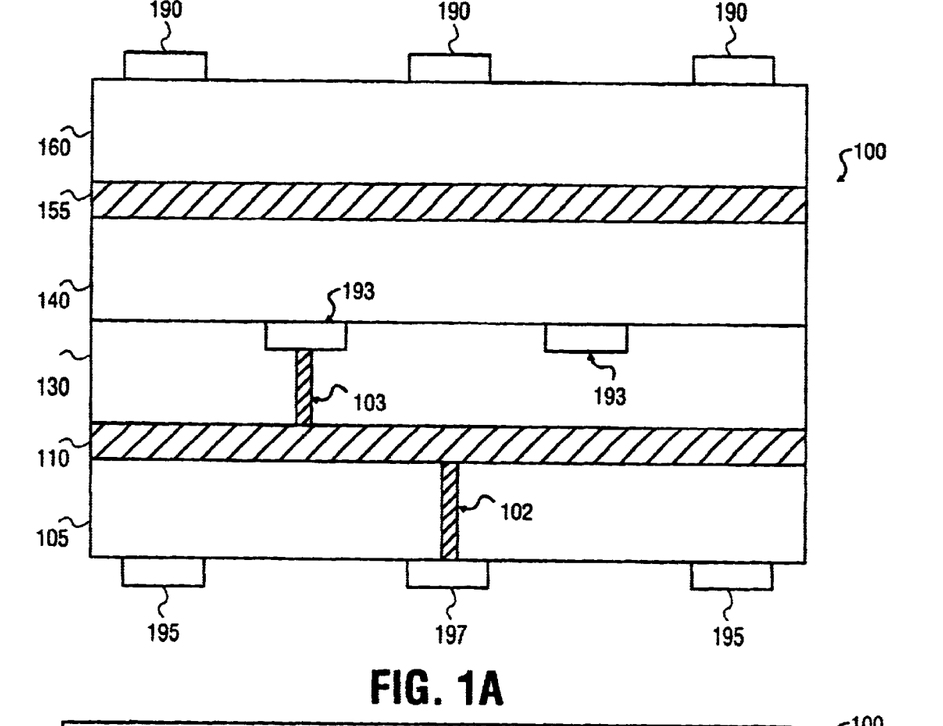
FIG. 1A is an illustration of a cross-sectional view of a PCB.
Figure 1B:
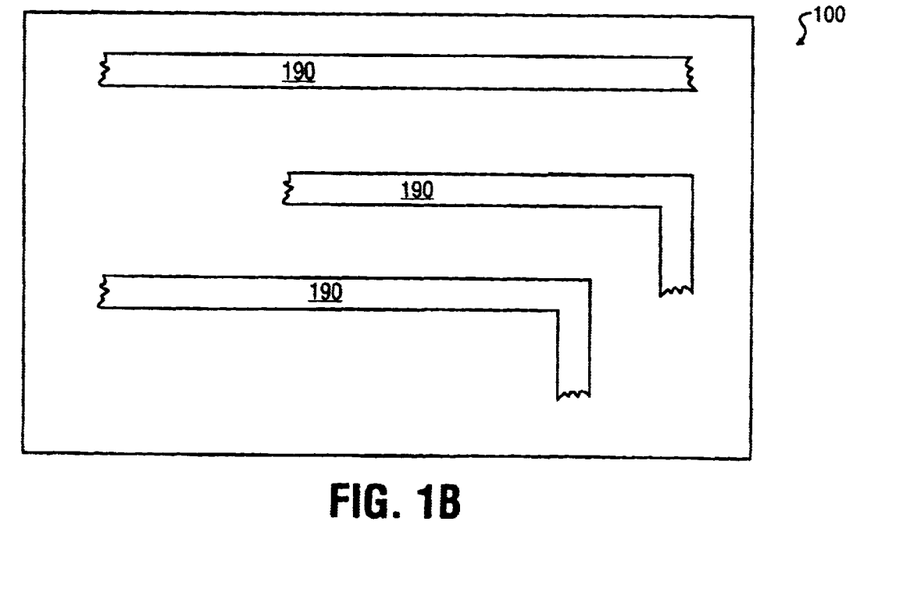
FIG. 1B is an illustration of a top view of the PCB of FIG. 1A.

FIG. 1A and FIG. 1B show a multi-layered PCB 100. FIG. 1A shows an illustration of a cross-sectional view of PCB 100. FIG. 1B shows an illustration of a top view of PCB 100 of FIG. 1A.

Referring to FIG. 1A, PCB 100 includes signal traces 190, 193, 195, and 197 and conductive planes 110 and 155. PCB 100 also includes insulation layers 105, 130, 140, and 160 formed in between the signal traces and conductive planes, a blind via 102, and a buried via 103.

Signal traces 195 and 197 are formed on a bottom side of insulation layer 105. Blind via 102 is formed in insulation layer 105. Conductive reference plane 110 is formed on insulation layer 105 and over blind via 102. Blind via 102 is a plated-through hole, which can be used to couple electrically conductive reference plane 110 with signal trace 197. Insulation layer 130 is formed on conductive reference plane 110. Buried via 103 and signal traces 193 are formed in insulation layer 130. Buried via 103 is a plated-through hole, which can be used to couple electrically one of the signal traces 193 with conductive reference plane 110. Insulation layer 140 is formed on insulation layer 130 and signal traces 193. Signal traces 195 and 197 can be used to interconnect electronic components (not shown) on the bottom side of insulation layer 105. Signal traces 193 can be used to interconnect electronic components on insulation layer 130. Signal traces 190 can be used to interconnect electronic components on insulation layer 160. As shown in FIG. 1B, signal traces 190 can have varying shapes and sizes.

Insulation layer 105 provides insulation between signal traces 195 and 197 and conductive reference plane 110. Insulation layer 130 and 140 provide insulation between conductive reference planes 110 and 155. Insulation layer 160 provides insulation between conductive reference plane 155 and signal traces 190. Conductive reference plane 155 is a ground plane, which can be used as a common electrical circuit return. Conductive reference plane 110 is a power plane, which can be used to provide specified potential to the signal traces.

In recent years, double-sided and multi-layered PCBs have become increasingly thinner to meet the demand of consumers for smaller and more compact electronic products. One way used to make thinner PCBs is by reducing the thickness of the insulation layers between the conductive planes. However, reducing the thickness of the insulation layers of the signal traces can affect the characteristic impedance of the signal traces on the PCBs.

The characteristic impedance of a signal trace is primarily determined by inductance and capacitance as shown in Equation (1):

$$Z_0 = \sqrt{\frac{L}{C}} \quad (1)$$

in which $Z_0$ is the characteristic impedance of the signal trace, L is the inductance per unit length of the signal trace, and C is the capacitance per unit length of the signal trace. Furthermore, the capacitance per unit length of the signal trace is generally expressed as shown in Equation (2)

$$C = \frac{KS}{d} \quad (2)$$

in which C is the capacitance per length of the signal trace, K is the dielectric constant, S is the electrode plate size (primarily width of the signal trace), and d is the distance between two electrode plates (the separation distance between the signal trace and the nearest conductive plane).

When these two equations are combined, the resulting equation is as shown in Equation (3)

$$Z_0 = \sqrt{\frac{Ld}{KS}} \quad (3)$$

According to Equation (3), if the inductance per unit length of the signal trace (L), dielectric constant (K), and the width of the signal trace (S) remain constant, the characteristic impedance of the signal trace can decrease by decreasing d, which is the separation distance between the signal trace and the nearest conductive plane.

Typically, the reduction of the separation distance is beneficial because such reduction reduces cross-talk and lessens the effects of electromagnetic interference ("EMI") on the signal traces. However, in certain applications, some signal traces, such as video signal traces, require higher impedances to match properly with electronic components, such as video displays, that operate with higher impedances.

According to Equation (3), the characteristic impedance of a signal trace can be increased by keeping the factors L, K, and S constant and increasing d, which is the separation distance between the signal trace and the conductive reference plane that is located closest to the signal trace. This, however, increases the thickness of an insulation layer thereby causing the characteristic impedance of all other signal traces on the insulation layer to be increased.

Another way to increase the characteristic impedance of a signal trace, according to Equation (3), is to decrease the width of the signal trace (S). However, decreasing the width of the signal trace may significantly increase the cost of fabricating a PCB and may violate manufacturing standards.

BRIEF DESCRIPTION OF THE DRAWINGS

The present invention is illustrated by way of example and not intended to be limited by the figures of the accompanying drawings, in which like references indicate similar elements and in which.

DETAILED DESCRIPTION OF THE PRESENT INVENTION

The present invention is a novel printed circuit board and method of making higher impedance traces on a lower impedance circuit board. A lower impedance circuit board refers to any circuit board having typical minimum size signal traces. In the following description numerous specific details such as specific materials, and dimensions, and processes are set forth in order to provide a thorough understanding of the present invention. One skilled in the art, however, will realize that the invention may be practiced without these specific details. In other instances, well-known circuit board manufacturing techniques and processes have not been described in particular detail so as to avoid unnecessarily obscuring the present invention.

The present invention is a novel circuit board and methods of increasing the characteristic impedance of a signal trace by forming a plurality of voids along the length of the signal trace in the nearest conductive reference plane(s) directly below and/or above the signal trace. The circuit board of the present invention is ideally suited for providing different impedance values to signal traces on an insulation layer.

Figure 2A:
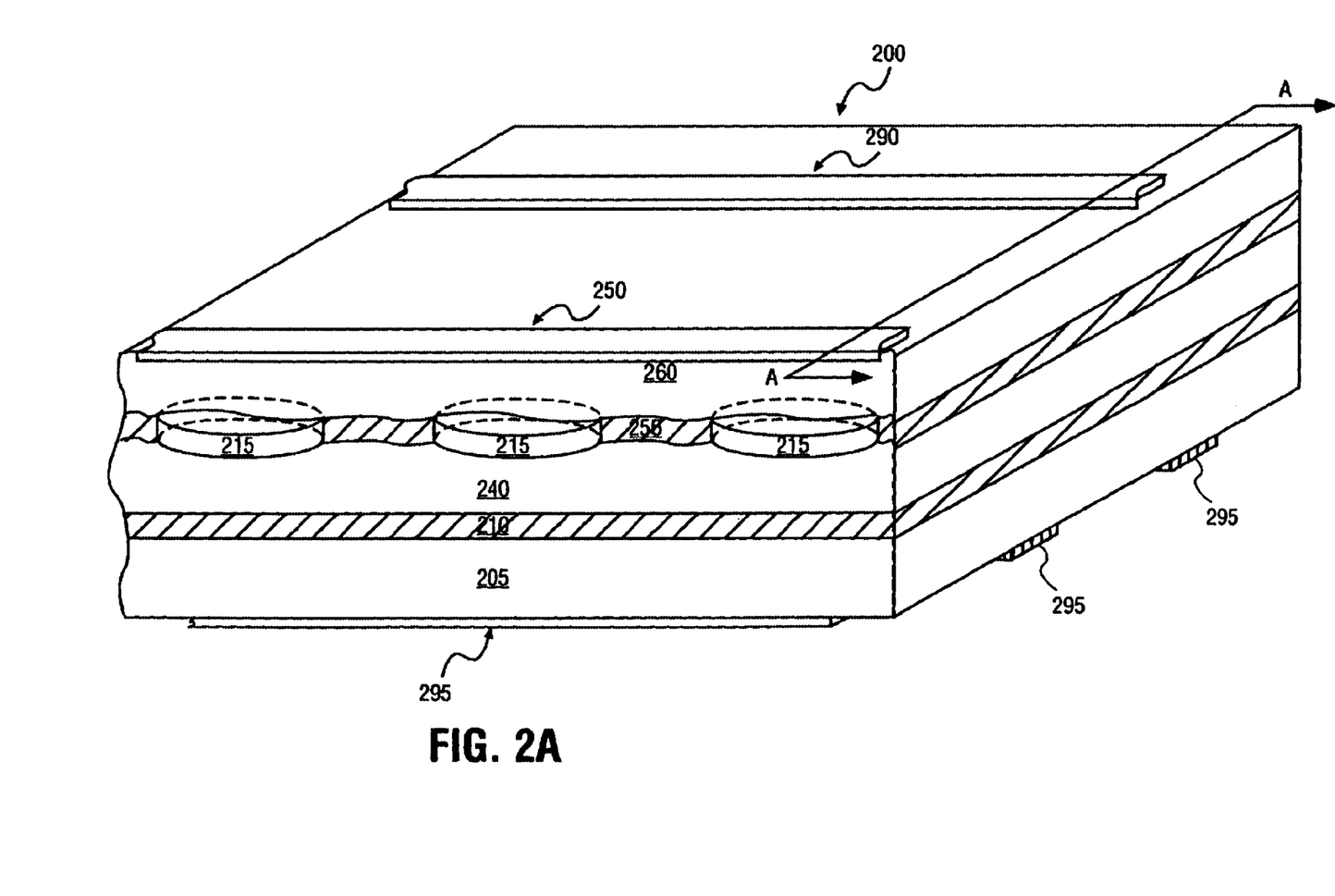
FIG. 2A is an illustration of a perspective cross-sectional view of a PCB along the line of a signal trace.

An example of a perspective cross-sectional view of a PCB 200 along the line of a signal trace in accordance with the present invention is shown in FIG. 2A. PCB 200 can be a four-layered PCB, a double-sided PCB, or any other multi-layered PCB having a plurality of voids.

PCB 200 includes signal traces 250, 290, and 295, conductive planes 210 and 255, and a plurality of voids 215. PCB 200 also includes insulation layers 205, 240, and 260 formed in between the signal traces and conductive planes.

Signal traces 295 are formed beneath an insulation layer 205. Conductive reference plane 210 is formed on insulation layer 205. Insulation layer 240 is formed on conductive reference plane 210. Conductive reference plane 255 is formed on insulation layer 240. The plurality of voids 215 are formed in conductive reference plane 255. Insulation layer 260 is formed on conductive reference plane 255 and over the plurality of voids 215.

Signal traces 250 and 290 are typical minimum size traces and are formed on insulation layer 260 having a constant thickness. Signal trace 250 is formed on insulation layer 260 such that some segments of the trace are located directly above the plurality of voids 215 and the other segments of the trace are not located directly above the plurality of voids 215. Signal trace 290 is formed on insulation layer 260 such that the trace is not located directly above the plurality of voids 215.

The segments of signal trace 250 located directly above the plurality of voids 215 have higher impedance than the segments of the signal trace 250 that are not located directly above the plurality of voids 215. That is, the plurality of voids 215 cause the segments located directly above the plurality of voids 215 to have higher impedance than the segments that are not. By creating the plurality of voids 215, the separation distance between conductive planes (i.e., between the segments of the signal trace 250 directly over the plurality of voids and a conductive plane) can be increased. Thereby, the impedance of the segments located directly above the plurality of voids 215 is increased in accordance with Equation (3).

The resulting characteristic impedance of signal trace 250 is the average impedance of all the segments of signal trace 250. As such, by increasing the impedance of the segments directly below the plurality of voids 215, signal trace 250 can have higher characteristic impedance than a signal trace, for example signal trace 290, which is not located directly under the plurality of voids 215.

Furthermore, the characteristic impedance of signal trace 250 can be increased to a predetermined value, if the size of the plurality of voids 215 and/or space between each of the plurality of voids 215 are set properly, relative to the signal rise time of signal trace 250. Generally, the size of the voids should be as small as practical, and the spacing of the voids should be as close as practical.

Because edge effects of the plurality of voids 215 make it hard to compute the resulting characteristic impedance of signal trace 250, the actual size and/or spacing of the plurality of voids 215 should be obtained experimentally with a test board. Then, when the proper size and/or spacing parameters of the plurality of voids 215 are obtained, the parameters can be plugged into a tool that generates the pattern for future circuit boards.

Signal traces 295, 290, 250 are typical minimum signal traces formed of a low resistance metal such as copper. Signal traces 295 can be used to interconnect electronic components (not shown) mounted beneath insulation layer 205. Signal traces 290 and 250 can be used to connect electronic components (not shown) mounted on insulation layer 260. Insulation layers 205, 240, and 260 provide insulation for each of conductive layers of PCB 200. Insulation layers 205, 240, and 260 are typically formed of non conductive material such as a standard FR4 fiberglass. The plurality of voids 215 are completely etched out openings. In one embodiment of the present invention, conductive reference plane 255 is a ground plane that can be used as a common electrical circuit return. Conductive reference plane 210 is a power plane that can be used to provide specified potential to the signal traces.

In one embodiment, signal trace 250 may be a signal trace that requires higher characteristic impedance than signal trace 290, which may have the characteristic impedance of approximately 60 ohms. Signal trace 250, for example, may be one of the RGB lines that carries video signals requiring the characteristic impedance of approximately 75 ohms. RGB lines are well known in the art, accordingly, a detailed description of its function is not provided herein. For example, to increase the characteristic impedance of signal trace 250 to approximately 75 ohms, 20 mil diameter voids in conductive reference plane 255 are placed directly under and along the length of signal trace 250 approximately every 100 mil of signal trace 250.

By forming a plurality of voids in a conductive reference plane below the length of a signal trace, cost-effective and flexible increase of an impedance value of the signal trace on an insulation layer of a circuit board may be achieved without reducing the signal trace width or the insulation layer thickness.

Figure 2B:
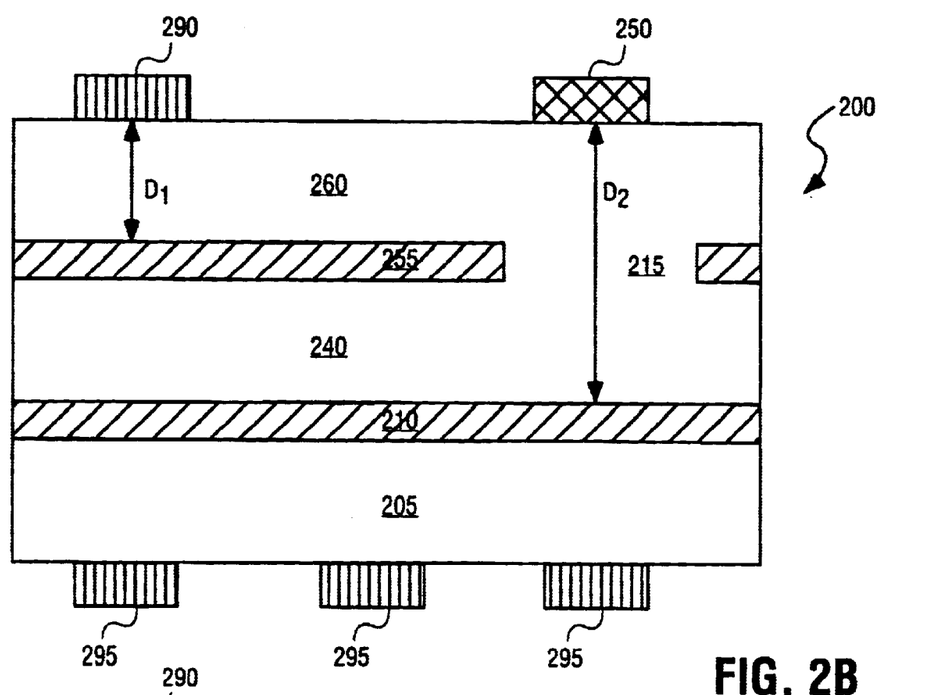
FIG. 2B is an illustration of a cross-sectional view along the line A—A of FIG. 2A.

FIG. 2B illustrates a cross-sectional view along the line A—A of the PCB 200 of FIG. 2A.

Signal traces 290 and 250 are formed on insulation layer 260, and signal traces 295 are formed beneath insulation layer 205. While signal trace 250 is formed directly over the plurality of voids 215 along the length of the trace, signal trace 290 is formed such that no voids are directly below it. Signal trace 290 and 295, and the plurality of voids 215 are aligned in predetermined locations with respect to one another such that the plurality of voids 215 do not affect the characteristic impedance of signal traces 290 and 295.

Unlike via holes, the plurality of voids 215 are openings formed in conductive reference plane 255 to increase the characteristic impedance of signal trace 250. By forming completely etched out openings directly under signal trace 250, the separation distance is increased between the segments of the signal trace 250 that is located directly above the plurality of voids 250 and a conductive reference plane. As a result, the overall characteristic impedance of signal trace 250 can be increased to a greater impedance value than the characteristic impedance of signal trace 290 and signal trace 295. The separation distance is increased from $D_1$ to $D_2$. In FIG. 2B, $D_1$ represents the distance between signal trace 290 and conductive reference plane 255, and $D_2$ represents the distance between signal trace 250 and conductive reference plane 210.

Figure 2C:
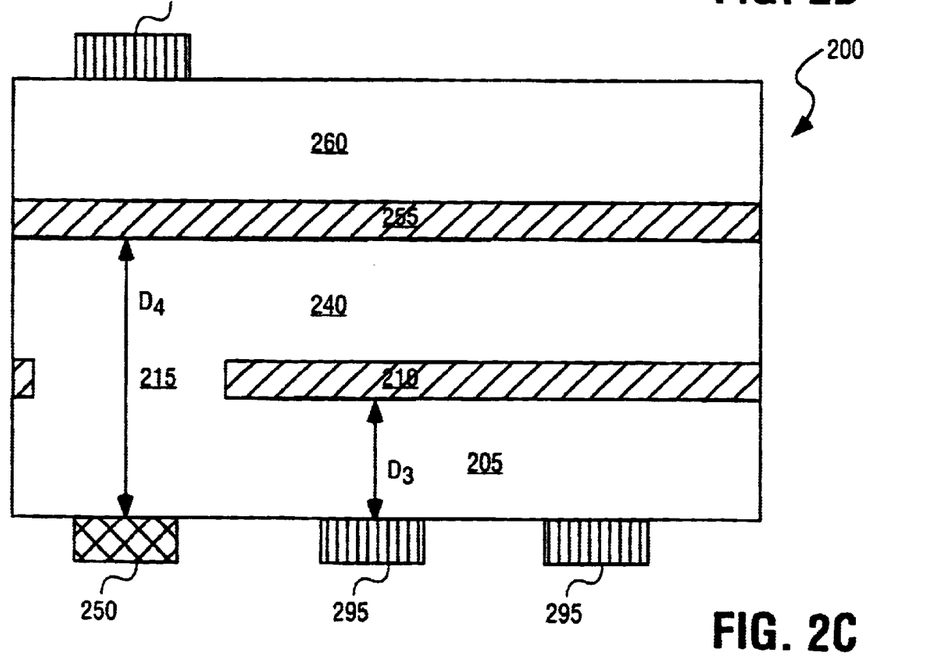
FIG. 2C is an illustration of a cross-sectional view of a PCB in accordance with an embodiment of the invention.

FIG. 2C illustrates a cross-sectional view of a PCB 200 in accordance with an embodiment of the invention.

PCB 200 includes signal traces 250, 290, and 295, conductive planes 210 and 255, and a plurality of voids 215. PCB 200 also includes insulation layers 205, 240, and 260 formed in between the signal traces and conductive planes.

Signal traces 250 and 295 are formed beneath insulation layer 205. Signal trace 250 is located directly below the plurality of voids 215 that is formed along the length of signal trace 250. Signal traces 295 are located such that no voids are directly over them. Conductive reference plane 210 having a plurality of voids 215 formed therein is formed on insulation layer 205. Insulation layer 240 is formed on conductive reference plane 210 and the plurality of voids 215. Conductive reference plane 255 is formed on insulation layer 240. Insulation layer 260 is formed on conductive reference plane 255. Signal trace 290 is formed on insulation layer 260.

Referring to the plurality of voids 215, the voids are completely etched out openings, but the voids can be filled with non-conductive material. The voids in the conductive reference plane 210 cause the separation distance between a conductive reference plane and the segments of signal trace 250 that is located below the plurality of voids 215 to increase from $D_3$ to $D_4$. Consequently, the overall characteristic impedance of signal trace 250 can be increased to greater impedance value than impedance of signal traces 290 and 295. In FIG. 2C, $D_3$ represents the distance between signal traces 295 and conductive reference plane 210, and $D_4$ represents the distance between signal trace 250 and conductive reference plane 255.

In one embodiment of the present invention, a plurality of voids can be formed directly above and below a signal trace to increase the characteristic impedance of the signal trace. That is, if a signal trace is layered in between two conductive reference planes, a first set of plurality of voids can be formed in the conductive reference plane located directly above the signal trace. Likewise, a second set of plurality of voids can be formed in the conductive reference plane located directly below the signal trace. The conductive reference plane directly above the signal trace and the signal trace act as a first capacitor. The conductive reference plane directly below the signal trace and the signal trace act as a second capacitor. When the first set of plurality of voids are formed, the conductive reference planes located above and the signal trace reduce their ability to act as the first capacitor. In the same manner, when the second set of plurality of voids are formed, the conductive reference plane located directly below and the signal trace reduce their ability to act as a second capacitor. As a result, the capacitance of the signal trace is decreased, thereby, increasing the characteristic impedance of the signal trace in accordance with Equation (1).

Referring back to FIG. 2C, signal traces 250 and 295 can be used to connect electronic components (not shown) mounted beneath insulation layer 205. Signal trace 290 can be used to connect electronic components (not shown) mounted on insulation layer 260. Insulation layers 205, 240, and 260 provide insulation for each of conductive layers of PCB 200. Conductive reference planes 255 and 210 can be either ground planes or power planes. The plurality of voids 215 are formed in conductive reference plane 210 to provide signal trace 250 higher impedance than the characteristic impedance of the typical minimum size signal traces, for example signal traces 290 and 295, on PCB 200.

Signal traces 295, 290, and 250 are typically formed of a low resistance metal such as copper. Insulation layers 205, 240, and 260 are typically formed of non-conductive material such as standard FR4 fiberglass. The plurality of voids 215 formed in conductive reference plane 255 over signal trace 250 is etched out openings.

Although the plurality of voids 215, may be in any shape such as square, rectangle, triangle, octagon, or in any various combinations thereof, a circular shape is preferable because the circular shape is easier to form and align with respect to trace signal 250.

In one embodiment, each of the plurality of voids may be a same size hole. In another embodiment, each of the plurality of voids may be a different size hole.

By forming a plurality of voids in a conductive reference plane proximately along the length of a signal trace, cost-effective and flexible increase of impedance values of the signal trace on an insulation layer of a circuit board may be achieved without reducing the signal trace width or the insulation layer thickness.

Figure 2D:
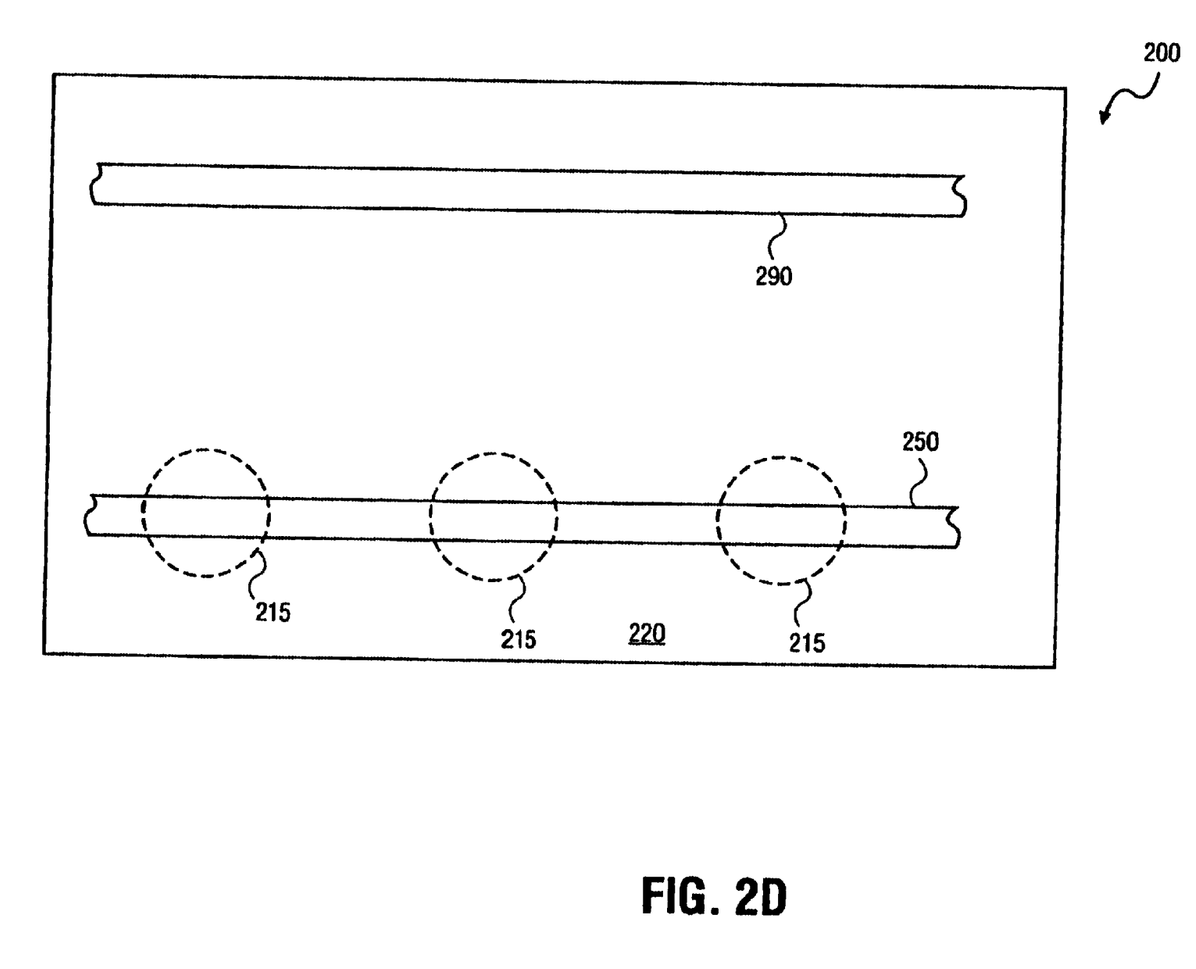
FIG. 2D is an illustration of a top view of the PCB of FIG. 2A in accordance with an embodiment of the invention.

FIG. 2D illustrates a top view of a portion of the PCB 200 of FIG. 2A. PCB 200 includes an insulation layer 220 formed on conductive reference plane (not shown) having a plurality of voids 215 formed therein. PCB 200 also includes signal traces 250 and 290 formed on insulation layer 220. While signal trace 250 is formed directly over the plurality of voids 215, signal trace 290 is formed such that no voids are located under it.

In one embodiment, signal trace 250 may pass over the centers of the plurality of voids 215. In another embodiment, signal trace 250 may pass over off-centers of the plurality of voids 215. Yet, in another embodiment, signal trace 250 may pass over the center of some of the plurality of voids 215 and an off-center of some of the plurality of voids 215.

Figure 3:
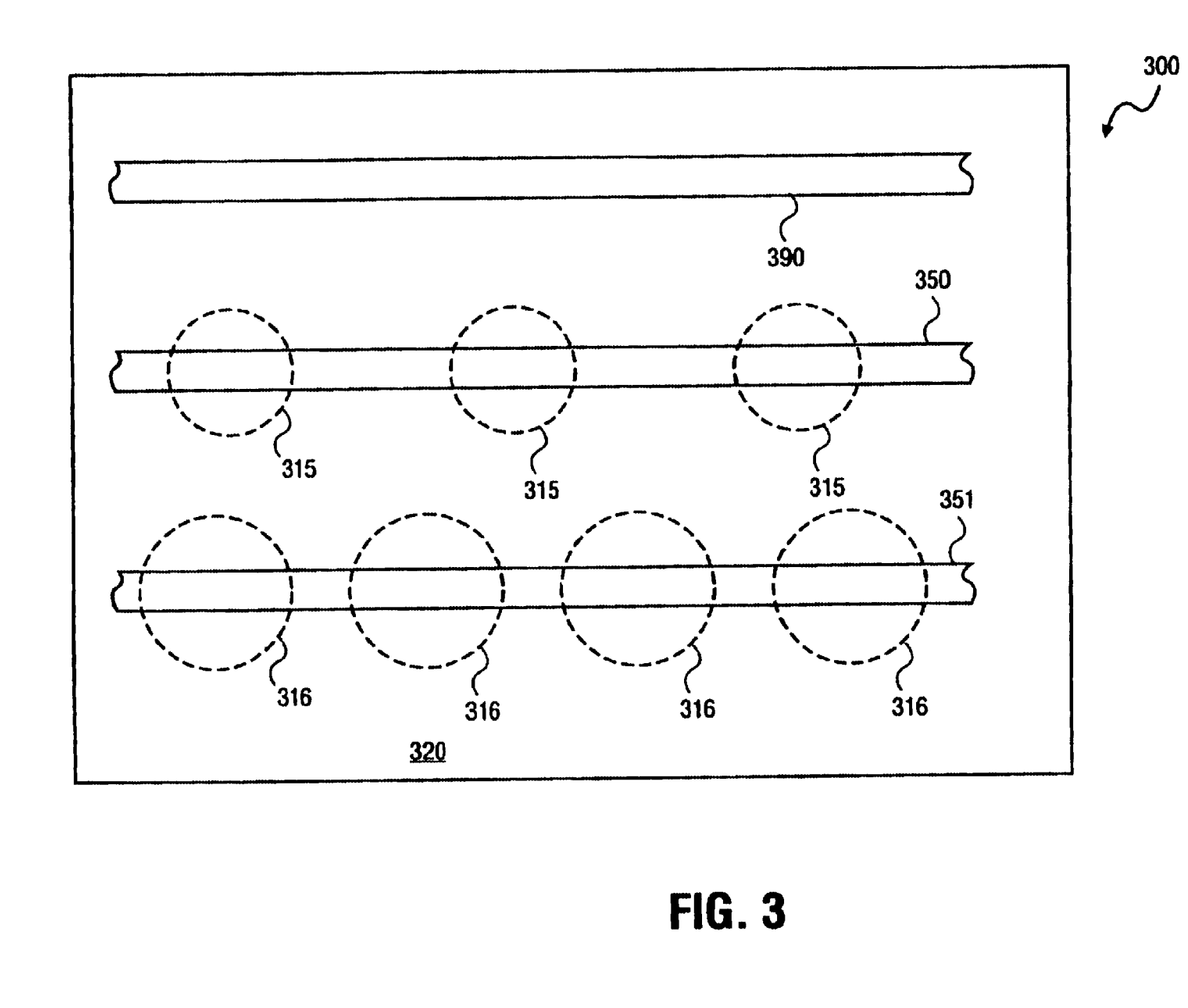
FIG. 3 is an illustration of a plain view of the PCB in accordance with an embodiment of the invention.

FIG. 3 illustrates a plain view of a portion of a PCB in accordance with an embodiment of the present invention. In one embodiment, PCB 300 can provide different impedance values to signal traces formed of a typical minimum size that are layered on an insulation layer.

PCB 300 includes an insulation layer 320 formed on a conductive reference plane (not shown) having plurality of voids 315 and 316 formed therein. PCB 300 also includes signal traces 390, 350, and 351.

Signal traces 390, 350, and 351 are formed on insulation layer 320. Signal trace 350 is formed directly over the plurality of voids 315 such that signal trace 350 passes over the plurality of voids 315. Signal trace 351 is formed directly over the plurality of voids 316 such that signal trace 351 passes over the plurality of voids 316. The plurality of voids 316, having bigger size of voids spaced closer together than the plurality of voids 315, are located directly below and along the length of signal trace 351. The plurality of voids 315 are located directly below and along the length of signal trace 350. Signal trace 390 is located such that no voids are directly under it.

Signal traces 390, 350, and 351 are typical minimum size signal traces, but provide different characteristic impedance values. Signal trace 390 provides the characteristic impedance value of a typical minimum size signal trace. Signal trace 350 and 351 provide higher impedance values than signal trace 390. Furthermore, signal trace 351 provides a higher impedance value than signal trace 350. That is, the plurality of voids 316 cause signal trace 351 to have a higher impedance value than signal trace 350. As mentioned previously, the resulting impedance of a signal trace is an average impedance of the signal trace. Since the plurality of voids 316 formed under signal trace 351 are bigger and spaced closer together than the plurality of voids 315 formed under signal trace 350, the average impedance of signal trace 351 can increase to a higher value than the average impedance of signal trace 350.

Figure 4:
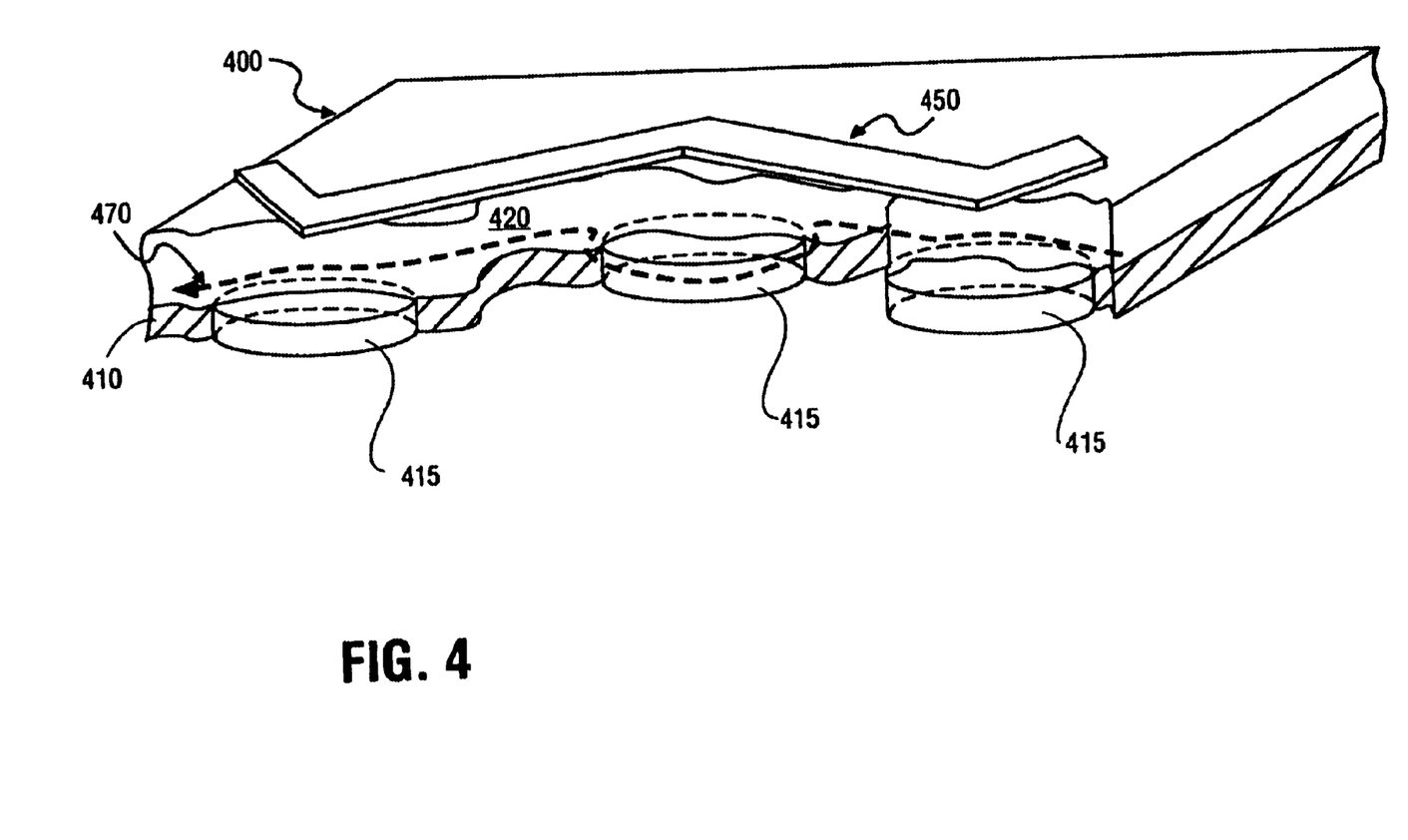
FIG. 4 is an illustration of a perspective view of a PCB in accordance with an embodiment of the invention.

FIG. 4 illustrates a perspective cross-sectional view of a portion of a PCB in accordance with an embodiment of the present invention. In one embodiment, PCB 400 may be a double-layered PCB, but in another embodiment, PCB 400 may be any other multi-layered PCB.

PCB 400 includes a conductive reference plane 410, an insulation layer 420, a signal trace 450, and a plurality of voids 415. Conductive reference plane 410 is formed beneath insulation layer 420. The plurality of voids 415 are formed in conductive reference plane 410, which is a ground plane. Signal trace 450 is formed on insulation layer 420.

In one embodiment, conductive reference plane 410 having the plurality of voids 415 formed therein may be formed adjacent to one side of the insulation layer 420, and signal trace 450 may be formed adjacent to the other side of the insulation layer 420.

Signal trace 450 is a zigzagged signal trace having a plurality of corners. The plurality of voids 415 are formed under the plurality of corners of signal trace 450 such that the plurality of corners passes over the plurality of voids 415. A signal return path 470 is located on conductive reference 410. Signal return path 470, that is the shortest return signal path having least resistance, is used to return the signal of signal trace 450.

Since the plurality of voids 415 are formed in conductive reference plane 410, the return signal of signal trace 450 that travels on conductive reference plane 410 has to travel around the plurality of voids 415 causing the length of signal return path 470 to be longer than the length of signal trace 450. As a result, noise can be increased on signal trace 450. One solution to the problem is to zigzag signal trace 450 to have a plurality of corners. Then, the plurality of voids 415 can be formed under the plurality of corners of signal trace 450 so that the length of signal return path 470 is shorter than or substantially equal to the length of signal trace 450. Generally, the return signal of signal trace 450 travels in between the plurality of voids 415 and parallel to signal trace 450, where it can, to minimize a loop area.

Figure 5:
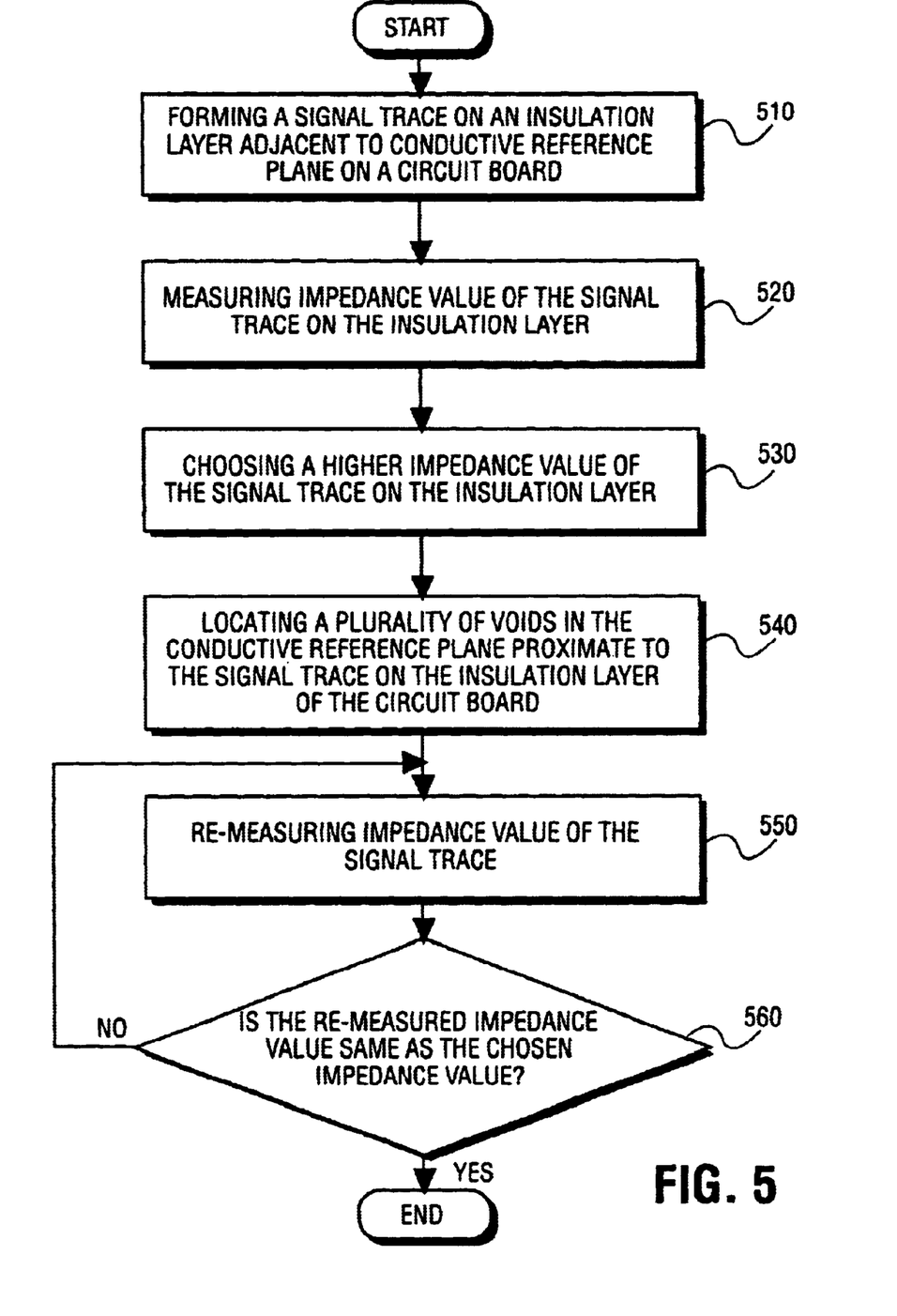
FIG. 5 is a flowchart illustrating a method of fabricating a circuit board having a plurality of voids.

FIG. 5 is a flowchart illustrating a method of fabricating higher impedance traces on a low impedance circuit board by empirical calculation.

First, as set forth in FIG. 5, a typical size signal trace is formed on an insulation layer having a conductive reference plane formed thereunder, Step 510. Next, as set forth in FIG. 5, the characteristic impedance of the signal trace is measured to determine the current impedance value, Step 520. In one embodiment, the characteristic impedance of the signal trace may be 60 ohms. Then, a higher characteristic impedance value of the signal trace is chosen, Step 530. In one embodiment, the signal trace may be a video signal trace of which the characteristic impedance requires to be increased to approximately 75 ohms.

Next, as set forth in Step 540, a plurality of voids in the conductive reference plane proximate to the signal trace is formed. When forming the plurality of voids, the size and shape of each of the plurality of voids, a space between each of the plurality of voids, and proximity of each of the plurality of voids in respect to the signal trace are calculated empirically. Then, as set forth in Step 550, the characteristic impedance value on the signal trace is re-measured. Next, as set forth in Step 560, the re-measured impedance value and the chosen impedance value are compared to see whether the chosen impedance value and the re-measured impedance value are substantially equal. If the chosen impedance value and the re-measured impedance value are substantially equal, then the proper parameters obtained by the empirical calculation is plugged into a tool that generates the pattern for future boards. However, if the chosen impedance value and the re-measured impedance value are not substantially equal, Step 540 and 550 are repeated until the values are substantially equal to obtain the proper parameters.

As such, cost-effective and flexible increase of impedance values of the signal traces on an insulation layer of a circuit board may be achieved without reducing the signal trace width or the insulation layer thickness.

What is claimed is:

1. A method of making higher impedance traces on a low impedance circuit board, comprising:

forming a signal trace on an insulation layer formed on a conductive reference plane of a circuit board;

measuring an impedance on said signal trace on said insulation layer;

choosing a higher impedance value on said signal trace on said insulation layer; and locating a plurality of voids in said conductive reference plane proximate to said signal trace on said insulation layer such that the chosen impedance value is achieved, locating the plurality of voids further includes determining a size and shape of each of said plurality of voids, a space between each of said plurality of voids, quantity of said plurality of voids, and proximity of each of said plurality of voids and said signal trace to increase said impedance to said higher impedance value.

2. The method of claim 1 further comprising zigzagging said signal trace to create a plurality of corners, wherein said plurality of corners of said zigzagged signal trace is located proximately to said plurality of voids.

3. The method of claim 1 further comprising locating said plurality of voids such that a length of a signal return path is shorter than or substantially equal to the length of said signal trace.

4. A method of forming a circuit board comprising:
   forming a conductive reference plane;
   forming a single trace over said conductive reference plane;
   forming a plurality of voids in said conductive reference plane, wherein said plurality of voids are located beneath said signal traces; and
   forming a signal return path, said signal return path located on said conductive reference plane, wherein said plurality of voids are located such that a length of said signal return path is shorter than or substantially equal to the length of said signal trace, wherein said signal return is located between said plurality of voids to minimize a loop area.

* * * * *